US006184532B1

(12) United States Patent
Dudnikov et al.

(10) Patent No.: US 6,184,532 B1
(45) **Date of Patent: *Feb. 6, 2001**

(54) ION SOURCE

(75) Inventors: Vadim G. Dudnikov, Beverly; Mehran Nasser-Ghodsi, Hamilton, both of MA (US)

(73) Assignee: Ebara Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/083,814

(22) Filed: May 22, 1998

Related U.S. Application Data

(63) Continuation-in-part of application No. 08/980,513, filed on Dec. 1, 1997, now abandoned.

(51) Int. Cl.[7] .............................. H01J 37/08; H01J 37/30

(52) U.S. Cl. .................................. 250/423 R; 250/492.21

(58) Field of Search .......................... 250/423 R, 492.21; 315/111.81

(56) References Cited

U.S. PATENT DOCUMENTS

| | | | | |
|---|---|---|---|---|
| 3,846,636 | | 11/1974 | Zehr et al. | 250/251 |
| 4,163,151 | * | 7/1979 | Bayless et al. | 250/423 R |
| 4,346,301 | * | 8/1982 | Robinson et al. | 250/492.21 |
| 4,361,472 | * | 11/1982 | Morrison | 204/192 R |
| 4,419,203 | | 12/1983 | Harper et al. | 250/251 |
| 4,542,321 | * | 9/1985 | Singh et al. | 250/423 R |
| 4,585,945 | | 4/1986 | Bruel et al. | 250/251 |
| 4,806,829 | | 2/1989 | Nakao | 315/111.81 |
| 4,873,445 | | 10/1989 | Le Jeune | 250/432 |
| 4,916,311 | | 4/1990 | Fuzishita et al. | 250/251 |
| 5,055,696 | | 10/1991 | Haraichi et al. | 250/492.2 |
| 5,256,947 | * | 10/1993 | Toy et al. | 250/423 R |
| 5,399,871 | | 3/1995 | Ito et al. | 250/492.21 |
| 5,432,342 | | 7/1995 | Nishimura et al. | 250/251 |
| 5,466,929 | | 11/1995 | Sakai et al. | 250/251 |
| 5,668,368 | | 9/1997 | Sakai et al. | 250/251 |
| 5,703,375 | | 12/1997 | Chen et al. | 250/492 |
| 5,750,987 | | 5/1998 | Ichimura et al. | 250/251 |
| 6,002,208 | * | 12/1999 | Maishev et al. | 250/423 R |

* cited by examiner

*Primary Examiner*—Bruce C. Anderson
(74) *Attorney, Agent, or Firm*—Armstrong, Westerman, Hattori, McLeland & Naughton

(57) ABSTRACT

An ion source is provided that is constructed for use with a magnet that produces magnetic flux lines extending in a predetermined direction and a source of ionizable material for creating ion. The ion source includes a chamber, defined by walls, and a relatively narrow outlet aperture for ions produced in the chamber to leave the chamber. The chamber encloses a cathode and an anode spaced from the cathode and from the walls of the chamber. The anode is positioned with respect to the aperture, the cathode and the predetermined direction of the magnetic flux to cause ions produced in the chamber to drift in crossed magnetic and electric fields so as to concentrate near the aperture.

22 Claims, 8 Drawing Sheets

BEAM CURRENT. 10keV 11B VERSUS ARC CURRENT

ION SOURCE

CROSS REFERENCE TO RELATED APPLICATIONS

This application is a continuation-in-part of application Ser. No. 08/980,513, filed Dec. 1, 1997 now abandoned.

This application is related to the commonly assigned applications "Space Neutralization of an Ion Beam", filed herewith today, Ser. No. 09/083,706, "Ion Implantation with Charge Neutralization", filed herewith today, Ser. No. 09/083,707, and "Transmitting a Signal Using Duty Cycle Modulation", filed Dec. 1, 1997, Ser. No. 08/982,210, each of which is incorporated by reference in its entirety.

BACKGROUND

This invention relates to an ion source, specifically an ion source for use in an ion implanter for implanting ions in a substrate.

In manufacturing semiconductors through ion implantation several types of ion sources are typically used. Ion implantation requires ion sources with long operational life and high ion source efficiency. One ion source used in ion implantation is the Bernas type ion source which has been widely accepted in ion implantation.

FIG. 1 shows a top view of a single filament Bernas type ion source 1 with its top plate removed. Ion source 1 has a cathode 12 connects to a power source that drives cathode 12 to therminiocally emit electrons. Walls 14 of ion source 14 are biased relative cathode 12 so as to act as an anode. A repeller plate 18 is positioned behind cathode 12 and another repeller plate 16 is positioned across from cathode 12. The ion source is placed in a uni-directional magnetic field, as shown in FIG. 1.

During operation, a gas to be ionized is discharged into the chamber and is ionized by electrons emitted from cathode 12. Repeller plates 16 and 18 reflect primary fast electrons emitted from cathode 12 and generate an oscillatory electron movement along the axis of the magnetic field. In this manner, a plasma is generated in the ion source between cathode 12 and walls 14 for extraction by an extraction electrode outside ion source 1.

When the ion source operates, material such as vaporized metal from cathode 12 are deposited and sputtered on walls 14 and create a film on walls 14. Because this material is usually adhered weakly to walls 12, it can generate particles and file-flakes which in turn can short out the cathode and anode, for example, by resting acrose insulations 18.

SUMMARY

In one general aspect, the invention features an ion source constructed for use with a magnet that produces magnetic flux lines extending in a predetermined direction and a source of ionizable material for creating ion. The ion source includes a chamber, defined by walls, and a relatively narrow outlet aperture for ions produced in the chamber to leave the chamber. The chamber encloses a cathode and an anode spaced from the cathode and from the walls of the chamber. The anode is positioned with respect to the aperture, the cathode and the predetermined direction of the magnetic flux to cause ions produced in the chamber to concentrate near the aperture.

In another general aspect, the invention features an ion source constructed for use with a magnet that produces magnetic flux lines extending in a predetermined direction. The ion source includes a chamber defined by walls, and a relatively narrow, elongated outlet slit for ions produced in the chamber to leave the chamber. The chamber encloses a cathode and an anode spaced from the cathode and from the walls of the chamber. The anode is elongated and positioned adjacent to and generally parallel to the slit. The ion source and magnet being relatively positioned such that the magnetic flux lines are generally parallel to the anode and at an angle to an electrical field produced between the anode and the cathode.

In yet another aspect, the invention features an ion implanter for implanting ions in a work piece. The ion implanter includes an ion source, a plurality of magnets to focus and scan the ion beam in a first direction, and a workpiece holder to hold the workpiece and to move perpendicular to the first direction. The ion source is constructed for use with a magnet that produces magnetic flux lines extending in a predetermined direction. The ion source includes a chamber defined by walls, and a relatively narrow, elongated outlet slit for ions produced in the chamber to leave the chamber. The chamber encloses a cathode and an anode spaced from the cathode and from the walls of the chamber. The anode is elongated and positioned adjacent to and generally parallel to the slit. The ion source and magnet being relatively positioned such that the magnetic flux lines are generally parallel to the anode and at an angle to an electrical field produced between the anode and the cathode.

Preferred embodiments of the invention may include one or more of the following features.

The aperture is a relatively narrow, elongated slit. The anode is elongated and positioned adjacent to and parallel to the aperture and may extend substantially the full length of the slit-form aperture. The anode is of generally rod form. The elongated anode is arranged to be substantially parallel with the predetermined direction of the magnetic flux.

The chamber is elongated in the direction of the elongated slit, two cathodes are located at each of the two ends. The cathodes are positioned symmetrically at either end of the chamber relative to the elongated slit and the anode. A negatively biased electrode can be used for sputtering material into the chamber for ionization.

The walls of the chamber can have a potential selected to deflect electrons. The walls of the chamber can have substantially the same potential as the cathode. The cathode can be a hot, indirectly heated, or cold cathode. The cathode can be a coil of tungsten wire, the coil having a generally circular form.

A magnet produces a magnetic field having flux lines in the above predetermined direction. The anode and chamber lie within the magnetic field. The magnet is arranged relative to the aperture and electrical field condition produced within the chamber to apply a force to the ions in the direction of the aperture. The lines of the magnetic field cross lines of an electrical field generated between the cathode and the anode. The anode is positioned with respect to the cathode to cause an electrical field between the anode and the cathode to concentrate the ions near the anode. The anode is positioned with respect to the aperture, the cathode, and the magnetic flux lines to cause ions near the anode to drift towards the aperture.

Embodiments of the invention may include one or more of these advantages.

Embodiments of ion source have efficient ion production because the anode being separated from the walls of the source allows the walls of the ion source to float relative to the anode and reach a potential close to that of the cathode potential. This results in the walls acting as an electron reflector rather than an anode. Therefore, the electrons can only be absorbed by an anode that is smaller than the walls. Therefore, the electrons trace an extended path in the source and increase the efficiency of the ion source.

In some embodiments, the material deposited on the walls strongly adhere to the walls, reducing the flaking of deposited material. This in turn reduces the possibility of the flakes short circuiting the source.

In other embodiments, because the cathode and the walls have the same potential, arcing in the source is reduced.

In some embodiments, the location of the anode relative to the magnetic field in which the ions source operates causes the plasma to drift towards the ion source emission slit and to concentrate near the emission slit. This increases the efficiency of extracting ions from the ion source and the current of the extracted beam.

DESCRIPTION

Figure 1:
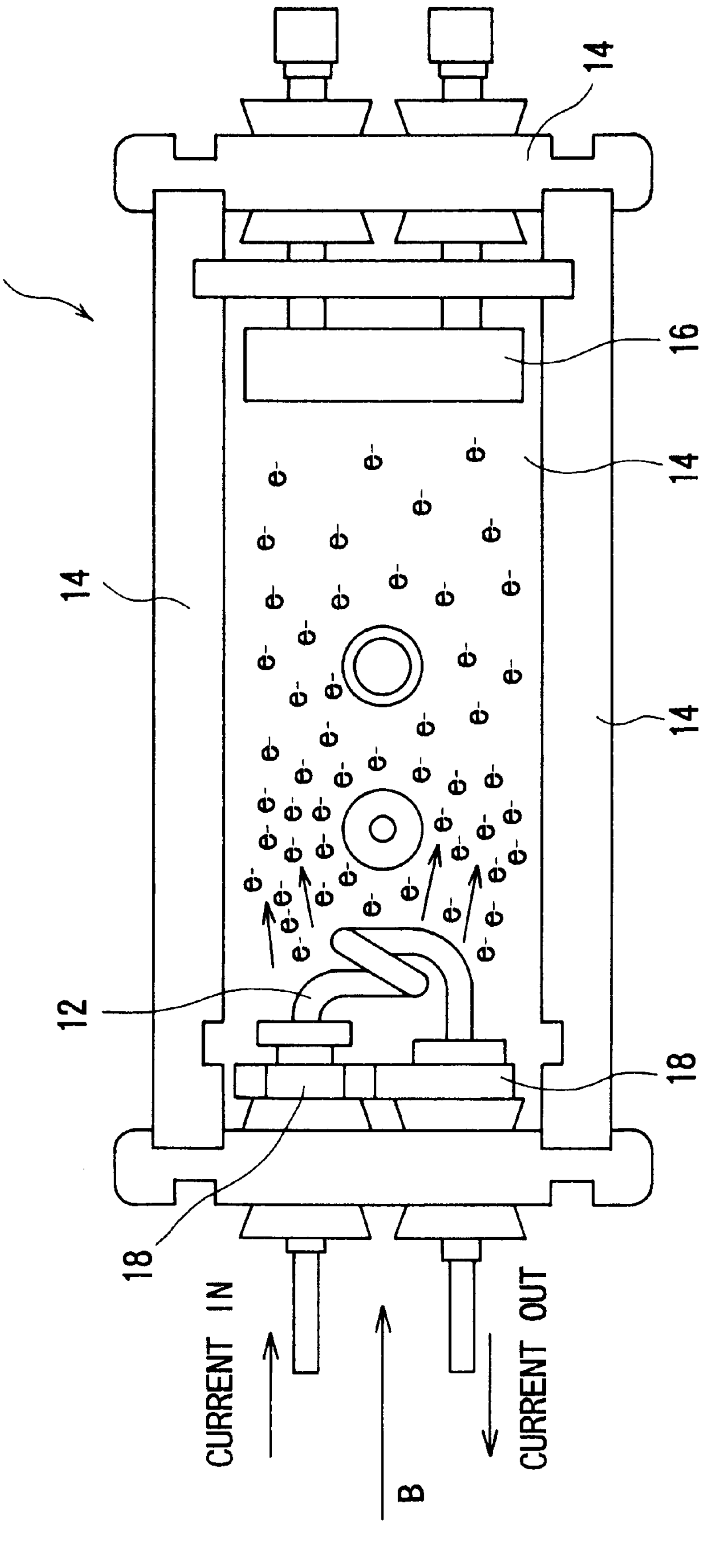
FIG. 1 (PRIOR ART)
FIG. 1 is a top view of a typical Bernas type ion source with its top plate removed.
Figure 2:
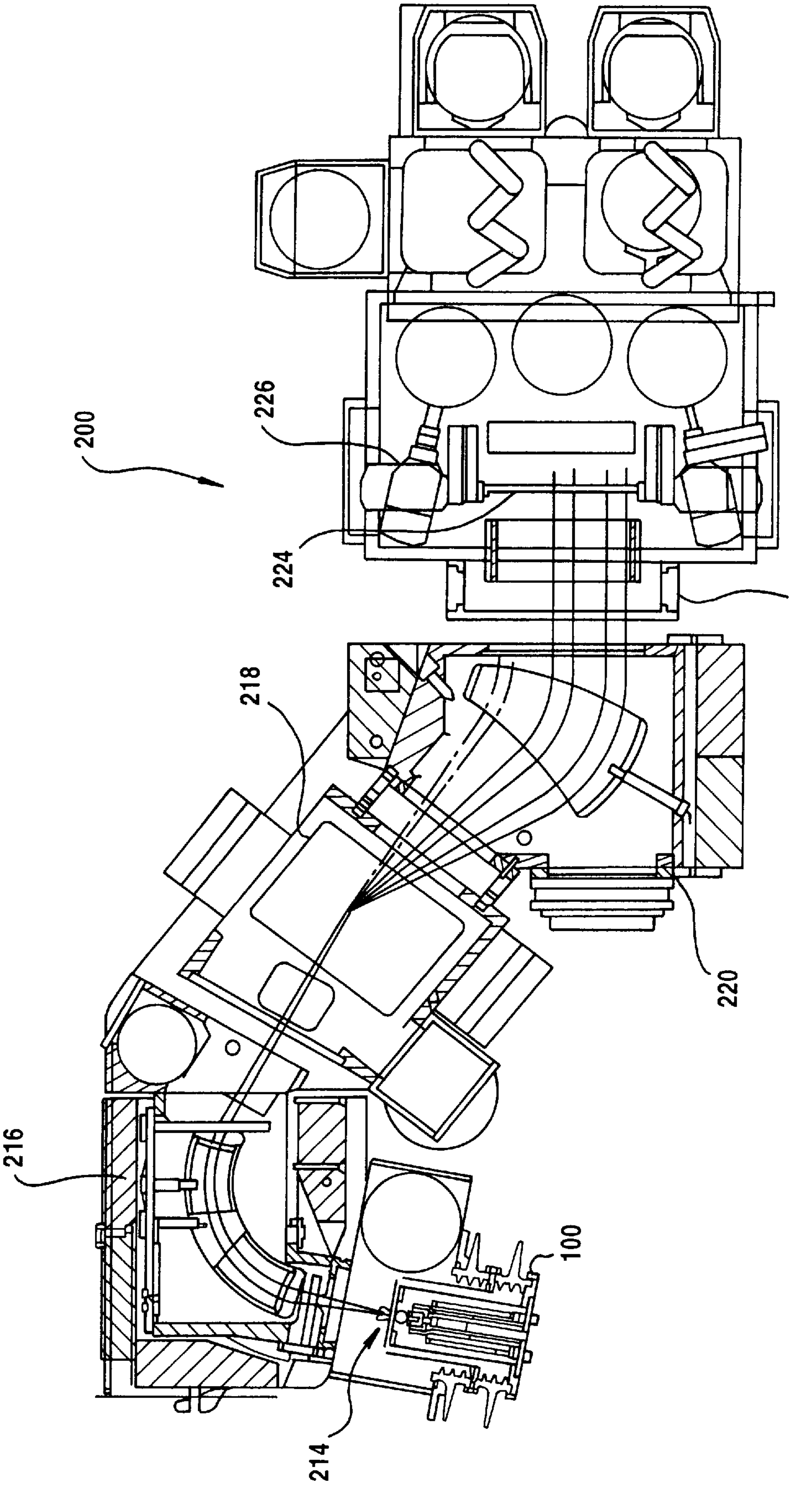
FIG. 2 is a plan view of an implanter in which an ion source according to the present invention is used.

FIG. 2 shows an example of an ion implanter 200 in which embodiments of an ion source according to this invention may be used. General features of such an ion implanter is disclosed in e.g. U.S. Pat. No. 5,393,984, hereby incorporated by reference.

Ion implanter 200 is composed of an ion source 100, an extractor electrode 214, an analyzer magnet 216, a scanner magnet 218, a collimator magnet 220, a plasma charge neutralizer 222 and a wafer 224. Generally, ion implanter 200 produces a ribbon-shaped beam which in some embodiments has a range of energies from 1 keV to 100 keV. The beam is a high current, high perveance beam (in some embodiments the beam has a perveance in the order of or greater than 0.02 (Ma) $(amu)^{1/2}$ $(KeV)^{31}$⅔), as explained in the referenced patent. The beam is magnetically scanned over the wafer in one direction. The wafer may also be moved in another direction to enable scanning in a second direction.

Ion source 100 generates positively charged ions for implantation, including gases such as argon, nitrogen, dis-associated boron (as in BF3), arsine, and phosphine. Solids may also be implanted after vaporization. Such solids include phosphorus, arsenic, and antimony. Other material may also be implanted. The ions emerge from an emission slit 10 (shown in FIG. 3), extracted by extraction electrode 214, which has a negative potential compared to the source. The shape and position of extractor electrode 214 is such that a well-defined ion beam emerges from the electrode.

Analyzer magnet 216 then analyzes the ion beam by removing undesired impurities according to the ion momentum to charge ratio (Mv/Q, where v is the velocity of the ion, Q is its charge, and M is its mass). Scanner magnet 218 then scans the ion beam in a direction perpendicular to the path of the beam. Following scanning, collimator magnet 220 reorients the ion beam such that the beam is parallel in the entire scan area.

Ion implanter 200 is sized to enable implantation on wafers that have a diameter of up to 300 millimeters. A wafer holder 226 holds wafer 224, at a selected angle within a range of angles of incidence of the beam to the wafer, preferably from normal incidence to the ion beam to less than 10°. In this embodiment, the ion beam is a ribbon shaped beam having a beam height (i.e. the length of the beam along a cross section of the beam) of 90 mm the source and 60 mm at the wafer.

Figure 3:
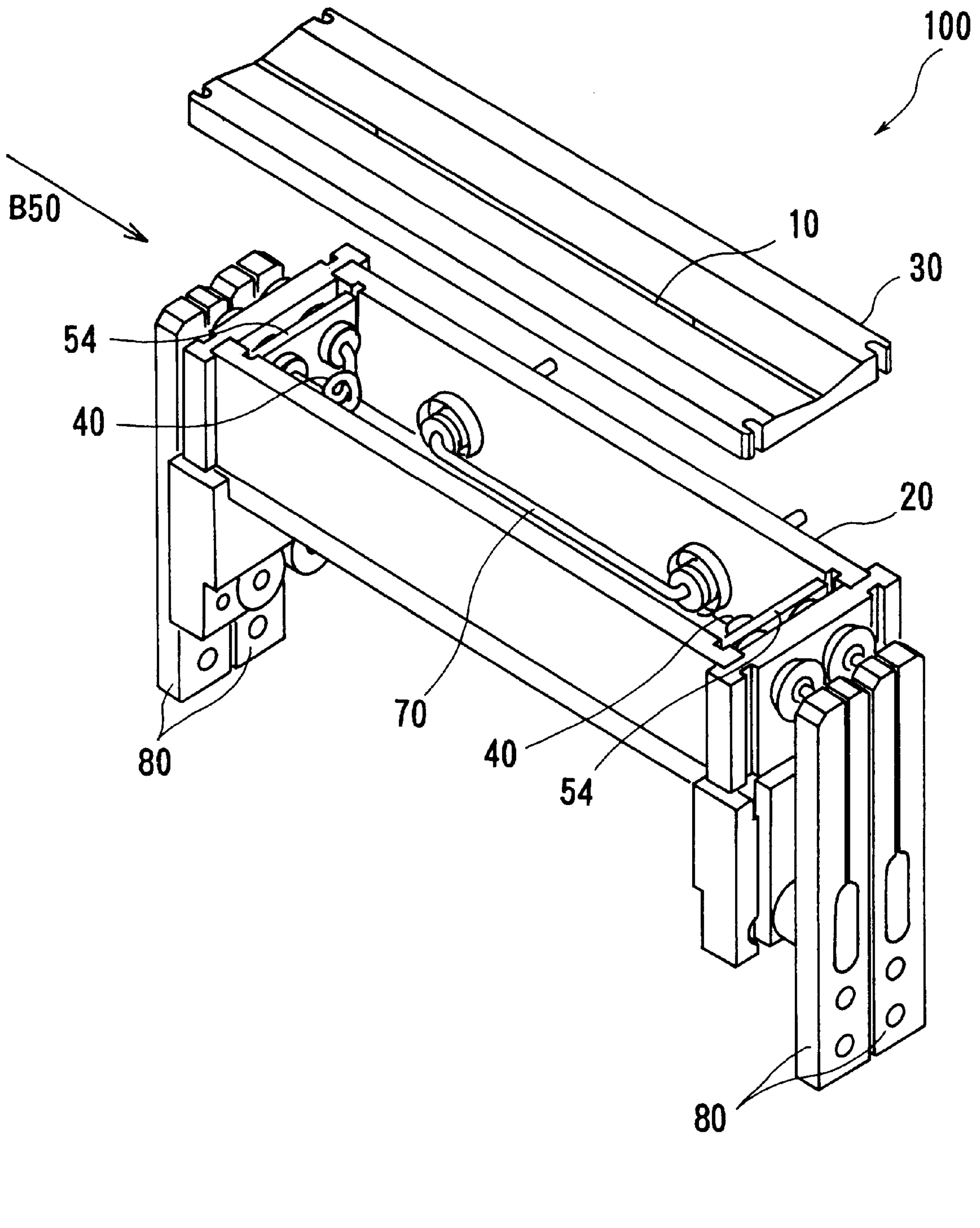
FIG. 3 is a perspective view of an embodiment of an ion source according to the present invention.
Figure 4:
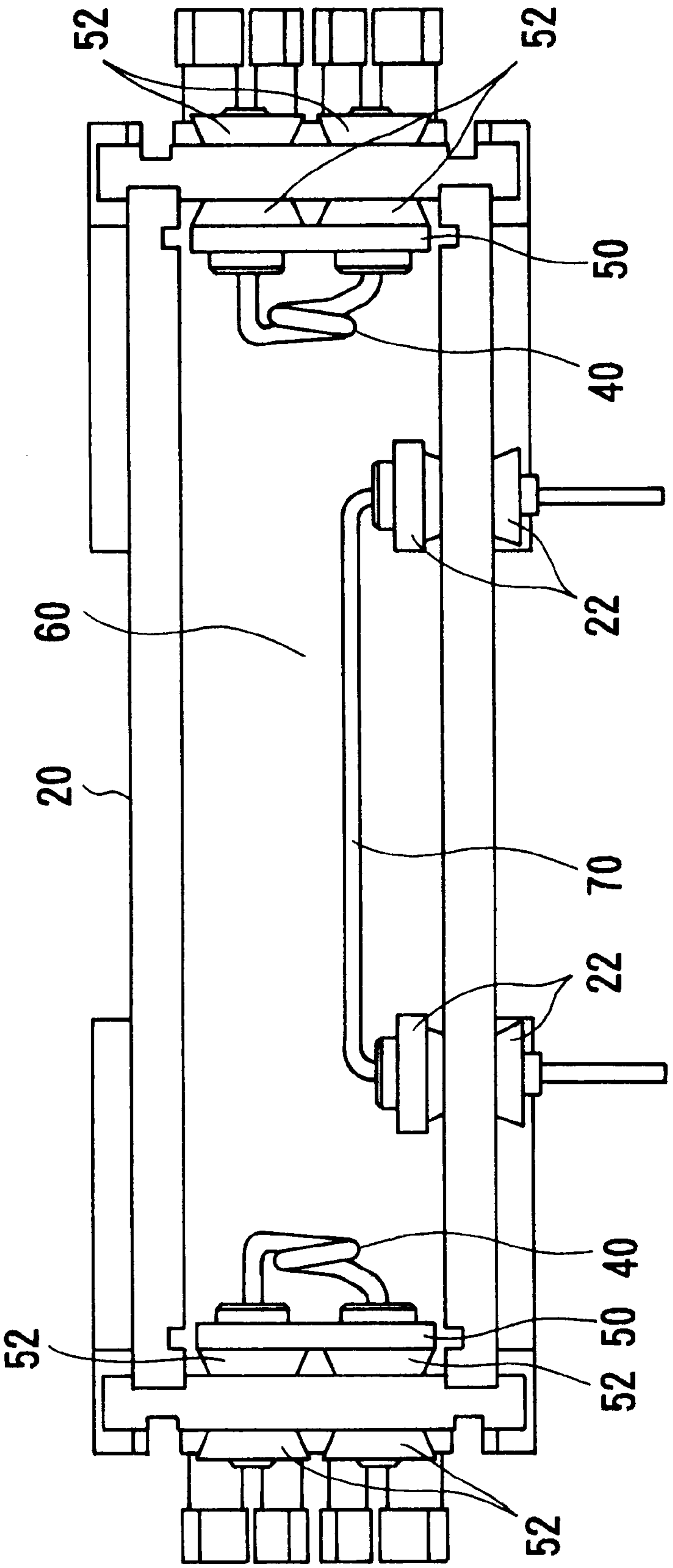
FIG. 4 is a top view of the ion source in FIG. 2 with its top plate removed.

Referring to FIGS. 3 and 4, ion source 100 includes walls 20 defining a vapor discharge chamber and a front plate 30. Front plate 30 includes an emission slit 10 which has an orientation parallel to the magnetic flux lines of a magnetic field 50 within which ion source 100 is placed during use. Emission slit 10 allows the plasma to be extracted in form of an ion beam from ion source 100. Ion source 100 also includes a gas vapor delivery port 60.

Ion source 100 has two spiral cathode filaments 40 wound such that the resulting magnetic field from flow of electricity through cathodes 40 has magnetic flux lines parallel to and in the same direction as the magnetic flux lines of magnetic field 50. Cathodes 40 are insulated from walls 20 by filament insulators 52.

Ion source 100 also includes an anode 70 that is spaced from and insulated from walls 20 by insulators 22. The positioning of anode 70 relative to other components of ion source 100 will be discussed in detail below. However, briefly, anode 70 is located near the emission slit and parallel to magnetic field 50. During use, an electrical field is generated between anode 70, cathodes 40, the plasma, and walls 20 (shown in FIG. 4A). This electrical field crosses the magnetic field 50. Anode 70 is positioned such that the crossed magnetic and electrical fields cause plasma generated in ion source 100 to drift towards emission slit 10 for better extraction of a high current ion beam. (Note that anode 70, cathodes 40, and emission slit are positioned symmetrically in ion source.)

Connectors 80 are used to connect cathodes 40 to power supplies during operation. Similar connectors (not shown) are provided for connecting anode 70 to power supplies during use.

Having described the structure of ion source 100, we will now describe the operation of ion source 100.

FIG. 4. shows how ion source 100 is connected during use. Cathodes 40 are connected to a power supply 90 via the connectors 80. Power supply 90 is a high current power supply which drives cathodes 40 so that cathodes 40 reach thermionic temperatures, e.g 2500° C. At these temperatures, cathodes 40 begin to emit electrons into the chamber of ion source 100. Anode 70 and the plasma extract further electrons from cathodes 40.

A biasing power supply 92 is connected to cathodes 40 and anode 70 to positively bias anode 70 relative to cathodes 40, e.g in the order of hundreds or thousands of volts. Walls 20 are connected to the negative terminal of power supply 92 via a resistor 94 which keeps walls 20 at a floating potential having approximately the same voltage as cathodes 40. In short, because anode 70 is separated and insulated from the walls, walls can be connected to float near the voltage of cathodes 40 as opposed to being at a voltage near that of anode 70.

Because walls 20 have a voltage near that of cathodes 40, the possibility of arcing between cathodes 40 and walls 20 across insulators 52 is reduced. Specifically, if walls 20 were at the same or near the voltage of anode 70, arcing could have occurred across insulators 52. This possibility could have increased as material, such as that evaporated from cathodes 40, deposited on insulators 52. Arcing across insulators 52 could then short circuit ion source 100. Arcing could also cause the deposited material to separate and become foreign particles in the plasma and contaminate the plasma. However, because in ion source 100, the wall can be kept near the voltage of cathodes 40, the potential difference across insulators 52 can be kept to a minimum so that there is little possibility of arcing across insulators 52.

Moreover, we have observed that material deposited in ion source 100 during operation are strongly bonded to walls 20 and are less likely to flake off and produce flakes. This strong adhesion to the walls may be because walls 20 are kept at a voltage close to that of cathodes 40 and therefore cause an ion assisted deposition of material on walls 20. Specifically, because of the biasing of walls 20 relative to anode 70, positive ions in the source are attracted to walls 20. The ions therefore bombard walls 20 and cause weakly bonded atoms that are deposited on walls 20 to separate. Therefore, only strongly bonded atoms remain on walls 20. These atoms are much less likely to create flakes.

The voltage at which walls 20 are kept also assists in plasma production. As electrons that are emitted from cathodes 40 travel inside ion source 100, magnetic field 50 deflects the electrons away from walls 20 and causes electrons to spin in the chamber of ion source 100. Each cathode 40 and its reflector plate 54 also reflect the electrons away from themselves. Moreover, walls 20, since they have a voltage near that of the cathode, also reflect the electrons. Since anode 70 has much smaller surface than walls 20, electrons generally have a much smaller target to find for reabsorption and therefore have longer life in ion source 100 than if walls 20 were at the anode potential. Therefore, electrons generally trace an extended path in ion source 100 and have a prolonged period to ionize the gas in ion source 100 and generate the plasma. Moreover, because all electrons eventually move toward anode 70, part of plasma production is concentrated near anode 70 which is also near emission slit 10.

Figure 4A:
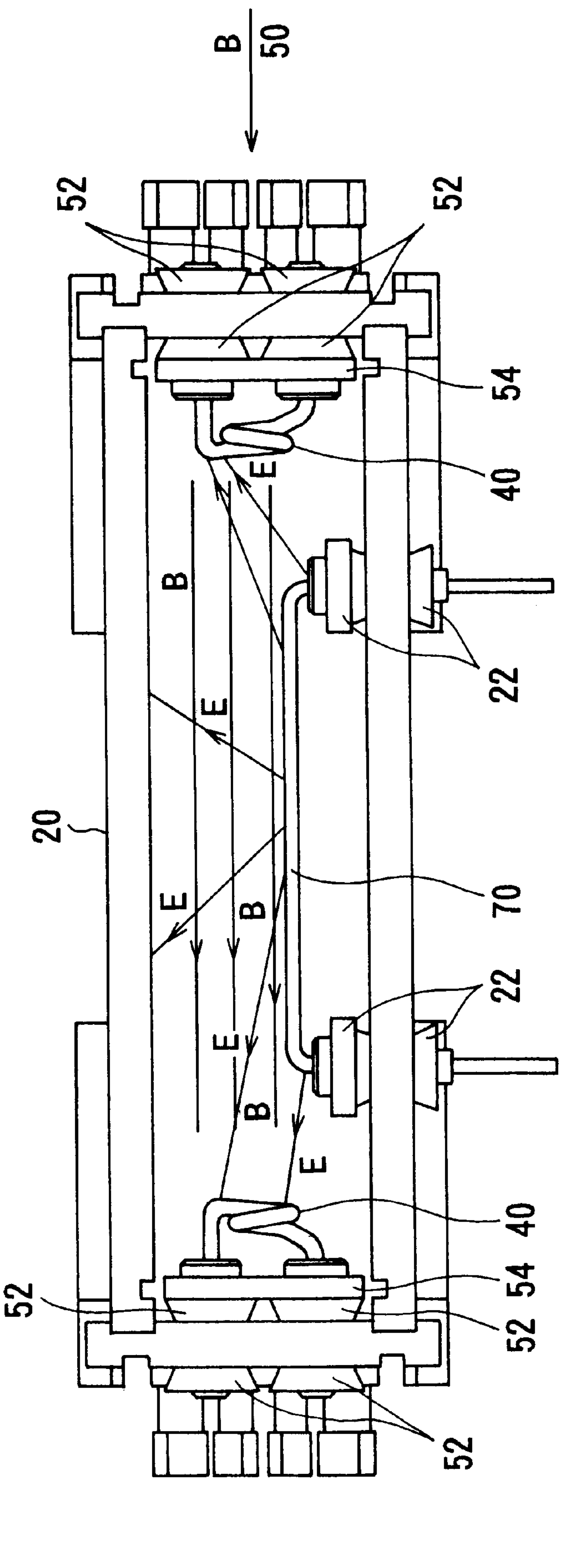
FIG. 4A is a top view of the ion source showing the relationship between magnetic field and the electrical fields in the source.
Figure 5:
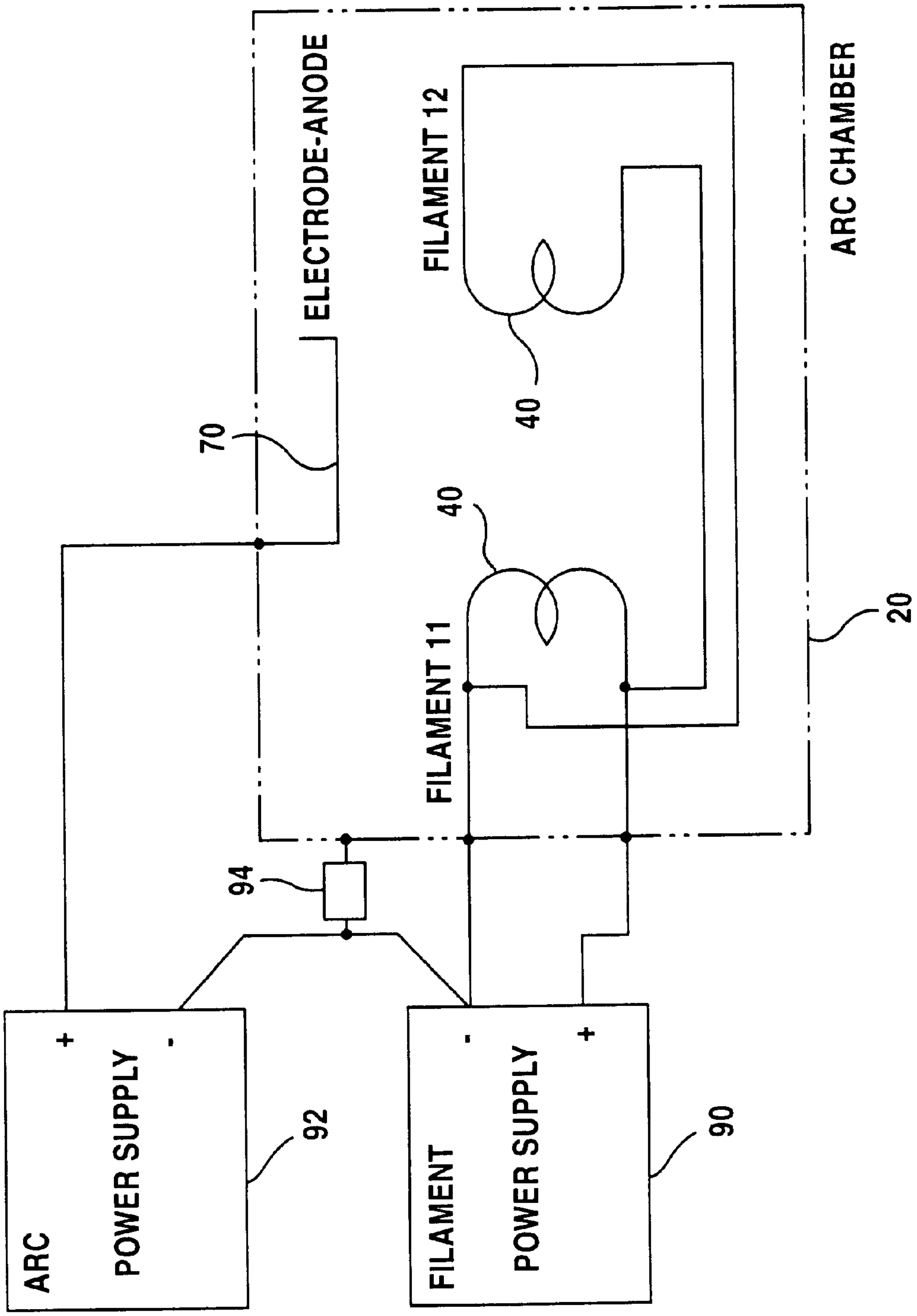
FIG. 5 shows the electrical circuit in which the ion source is connected during use.

As described briefly above, referring to FIG. 4A, the potential difference between anode 70, and cathodes 40 and walls 20 results in an electric field that crosses the lines of magnetic field 50. The crossed electric and magnetic fields result in the plasma drifting towards the emission slit 10 and causing a high density of ions to gather near emission slit 10 for being extracted.

The position of anode 70 relative to magnetic field 50 determines the direction of the drift, because the position of anode 70 determines the direction of the electric field lines relative to the flux lines of magnetic field 50. Generally, the electric field in ion source 100 applies a force on the positive ions in source 100 along the electric field lines. Magnetic field 50 in turn applies a deflecting force on the ions perpendicular to their plane of motion in the electric field. The direction of this deflecting force is determined by the so called "right-hand rule" (e.g. see Raymond A. Serway, *Physics: For Scientists and Engineers* (1982) 539, incorporated by reference). According to a version of the right hand rule, if one holds one's right hand such that one's thumb, index and middle fingers are all perpendicular to one another and the index finger represents the direction of the movement of the positive ion (or the electric field lines) and the middle finger represents the direction of the magnetic field, then the thumb represents the direction of the force exerted on the positive ion. In the case of ion source 100, the anode is located such that the force on positive ions is upwards towards emission slit 10. This results in plasma drifting toward emission slit 10 for more efficient extraction by the extraction electrode and a higher beam current. Moreover, anode 70 is located near emission slit 10 to further assist in concentrating the plasma near emission slit 10.

Figure 6:
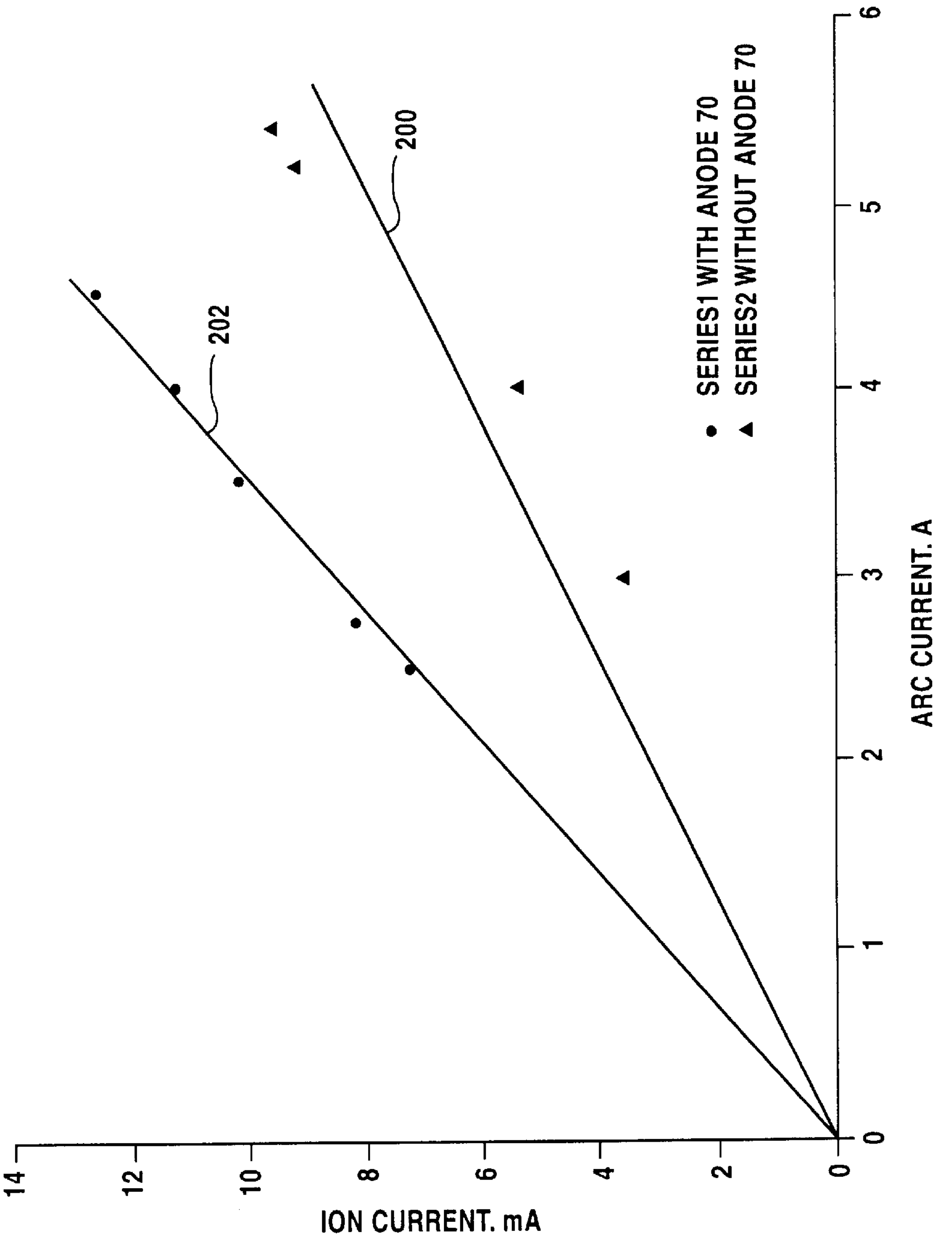
FIG. 6 shows results of an experiment conducted on the performance of an embodiment of an ion source according to the present invention.

FIG. 6 shows results of an experiment with an embodiment of an ion source constructed according to the principles disclosed herein. During the experiment, a 10 KeV $11B^+$ beam was generated. A Faraday cup was placed after the analyzer magnet. An oscilloscope recorded the current of the beam arriving at the Faraday cup as the arc current was varied. The arc current was varied by keeping constant the potential difference between the cathode and the anode while varying the filament heating. Graph 200 shows a relationship between the beam current and the arc current when the walls were used as the anode. Graph 202 shows the relationship when an anode similar to anode 70 was used and the wall was allowed to float at a potential near the cathode potential. As can easily be seen, for the same arc current, when the anode similar to anode 70 was used, the ion beam current was higher than when the walls were used as the anode.

Other embodiments are within the scope of the claims below.

Figure 7:
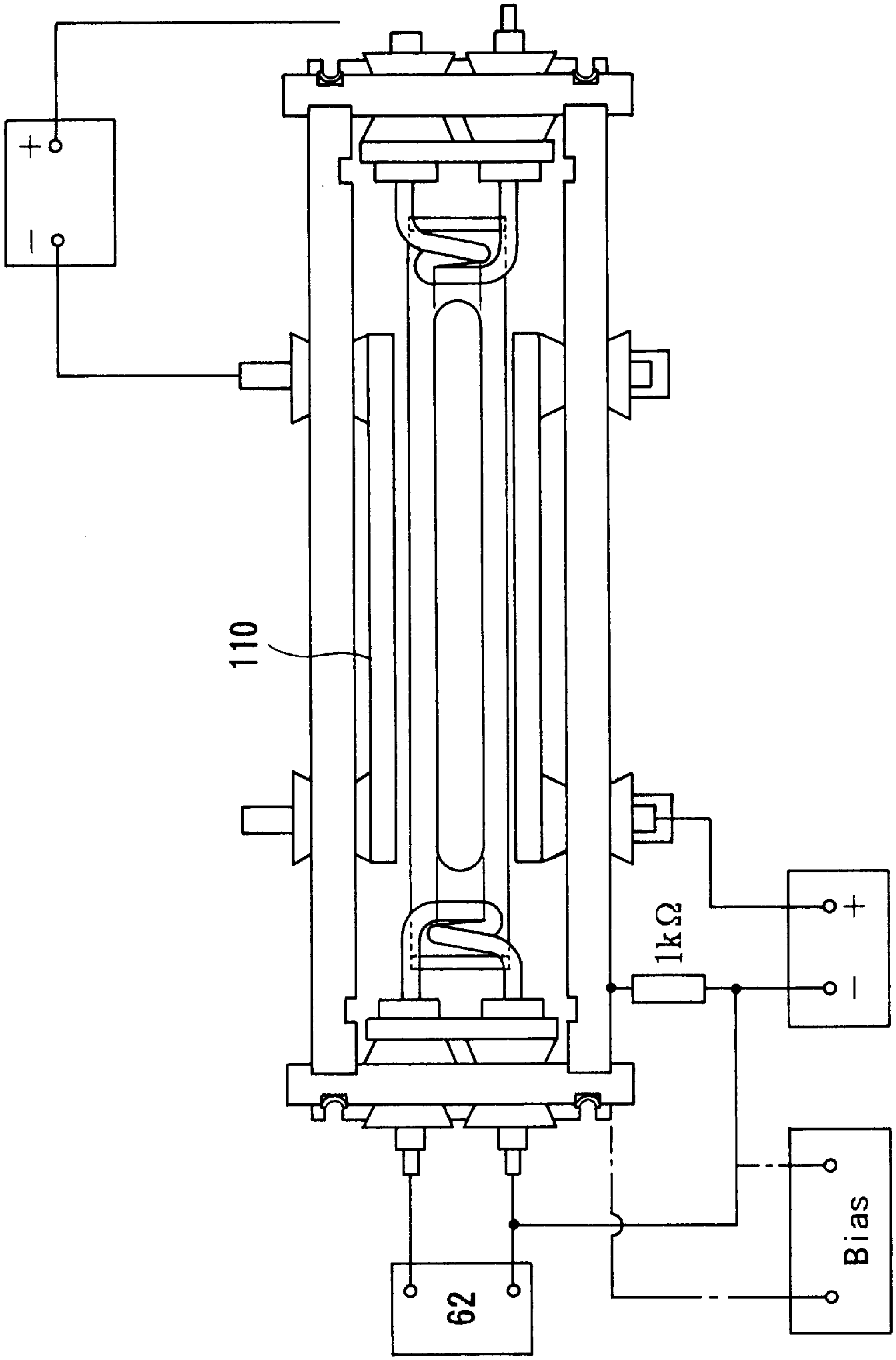
FIG. 7 shows an alternative embodiment of a ion source according to the present invention.

For example, referring to FIG. 7, ion source 100 may include a sputtering electrode 110. This electrode may be coated with a solid material that is to be implanted. Alternatively, electrode 110 may be made out of the material to be implanted. This electrode may be held at a negative potential relative to anode 70 so that it attracts positive ions in the chamber. These ions bombard the electrode and cause atoms of the material on electrode 110 to sputter into the chamber of the ion source. This material then forms a plasma which is then extracted for implantation. Typically, positive ions that bombard electrode 110 are positive ions in the plasma. An inert gas such as Argon may be used to create a plasma to begin the sputtering process or to assist with the sputtering process.

Other embodiments of the invention may include using the principle of the invention in other types of ion sources such as cold cathode, indirectly heated cathode or Freeman sources.

What is claimed is:

1. An ion source constructed for use with a magnet that produces magnetic flux lines extending in a predetermined direction and a source of ionizable material for creating ions, the ion source comprising:

a chamber, said chamber being defined by walls, a relatively narrow outlet aperture for ions produced in the chamber to leave the chamber, the chamber enclosing a cathode, an anode spaced from the cathode and from the walls of the chamber, and the anode being positioned with respect to the aperture, the cathode and the predetermined direction of the magnetic flux to cause ions produced in the chamber to concentrate near the aperture, wherein said walls, which are separate from said cathode, have substantially the same voltage as said cathode.

2. The ion source of claim 1 wherein the aperture is a relatively narrow, elongated slit.

3. The ion source of claim 2 wherein the anode is elongated and positioned adjacent to and parallel to the aperture.

4. The ion source of claim 3 wherein there is a single anode extending substantially the full length of the slit-form aperture.

5. The ion source of claim 3 or 4 wherein the anode is of generally rod form.

6. The ion source of claim 3 wherein the elongated anode is arranged to be substantially parallel with the predetermined direction of the magnetic flux.

7. The ion source of claim 2, 3, 4 or 6 wherein the ion source comprises a second cathode, and the chamber is elongated in the direction of the elongated slit, the chamber, having two ends, there being a cathode located at each of the two ends.

8. The ion source of claim 7 wherein the ion source comprises the cathodes are positioned symmetrically at either end of said chamber relative to said elongated slit and said anode.

9. The ion source of claim 1 wherein the walls of the chamber have a potential selected to deflect electrons.

10. The ion source of claim 1 wherein the walls of the chamber have substantially the same potential as the cathode.

11. The ion source of claim 1 wherein the anode lies within the magnetic field.

12. The ion source of claim 1 wherein the chamber lies within the magnetic field.

13. The ion source of claim 1 wherein the cathode is a hot, indirectly heated, or cold cathode.

14. The ion source of claim 1 wherein the cathode is a coil of tungsten wire, the coil having a generally circular form.

15. The ion source of claim 1 wherein lines of the magnetic field cross lines of an electrical field generated between the cathode and the anode.

16. The ion source of claim 1 wherein the anode is positioned with respect to the cathode to cause an electrical field between the anode and the cathode to concentrate the ions near the anode.

17. The ion source of claim 1 wherein the anode is positioned with respect to the aperture, the cathode, and the magnetic flux lines to cause ions near the anode to drift towards the aperture.

18. The ion source of claim 1 further comprising a negatively biased electrode for sputtering material into the chamber for ionization.

19. The system of claim 18 wherein the magnet is arranged relative to the aperture and electrical field condition produced within the chamber to apply a force to the ions in the direction of the aperture.

20. A system comprising the ion source of claim 1 and a magnet producing a magnetic field having the flux lines in the predetermined direction.

21. An ion source constructed for use with a magnet that produces magnetic flux lines extending in a predetermined direction, the ion source comprising:

a chamber, said chamber being defined by walls, a relatively narrow, elongated outlet slit for ions produced in the chamber to leave the chamber, the chamber enclosing a cathode, an anode spaced from the cathode and from the walls of the chamber, the anode being elongated and positioned adjacent to and generally parallel to the slit, the ion source and magnet being relatively positioned such that the magnetic flux lines are generally parallel to the anode and at an angle to an electrical field produced between the anode and the cathode, wherein said walls, which are separate from said cathode, have substantially the same voltage as said cathode.

22. An ion implanter for implanting ions in a work piece comprising:

an ion source, a plurality of magnets to focus and scan the ion beam in a first direction, a workpiece holder to hold the workpiece and to move perpendicular to the first direction, wherein the ion source is constructed for use with a magnet that produces magnetic flux lines extending in a predetermined direction, the ion source comprising:

a chamber, said chamber being defined by walls, a relatively narrow, elongated outlet slit for ions produced in the chamber to leave the chamber, the chamber enclosing a cathode, an anode spaced from the cathode and from the walls of the chamber, the anode being elongated and positioned adjacent to and generally parallel to the outlet slit, the ion source and magnet being relatively positioned such that the magnetic flux lines are generally parallel to the anode and at an angle to an electrical field produced between the anode and the cathode, wherein said walls, which are separate from said cathode, have substantially the same voltage as said cathode.

* * * * *